United States Patent
Cheng et al.

(10) Patent No.: US 9,755,623 B2
(45) Date of Patent: Sep. 5, 2017

(54) MULTI-BIT FLIP-FLOP WITH SHARED CLOCK SWITCH

(71) Applicant: FREESCALE SEMICONDUCTOR, INC., Austin, TX (US)

(72) Inventors: Zhihong Cheng, Suzhou (CN); Peidong Wang, Suzhou (CN); Yang Wang, Suzhou (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/230,459

(22) Filed: Aug. 7, 2016

(65) Prior Publication Data
US 2017/0063350 A1    Mar. 2, 2017

(30) Foreign Application Priority Data
Sep. 1, 2015 (CN) .......................... 2015 1 0723964

(51) Int. Cl.
H03K 3/356      (2006.01)
H03K 3/3562    (2006.01)

(52) U.S. Cl.
CPC ................................ *H03K 3/35625* (2013.01)

(58) Field of Classification Search
CPC .. H03K 3/01; G09G 3/3688; G09G 2310/027; G09G 2310/0297; G09G 2310/0252
See application file for complete search history.

(56) References Cited

U.S. PATENT DOCUMENTS

| 4,808,853 A * | 2/1989 | Taylor .............. H03K 19/09429 326/119 |
| 6,828,837 B2 | 12/2004 | Ahn |
| 7,405,606 B2 | 7/2008 | Kok |
| 7,868,677 B2 | 1/2011 | Jain |
| 8,941,429 B2 | 1/2015 | Cheng |
| 2007/0097579 A1 * | 5/2007 | Amamiya ........... H03F 3/45085 361/100 |
| 2007/0273420 A1 | 11/2007 | Torvi |
| 2011/0095799 A1 | 4/2011 | Ramaraju |
| 2013/0147534 A1 | 6/2013 | Cheng |

FOREIGN PATENT DOCUMENTS

JP    2004-064557    2/2004

OTHER PUBLICATIONS

Mototsugu Hamada, et al., "A Conditional Clocking Flip-Flop for Low Power H.264/MPEG-4 Audio/Visual CODEC LSI", IEEE Custom Integrated Circuits Conference 2005, pp. 527.

* cited by examiner

*Primary Examiner* — Sibin Chen
(74) *Attorney, Agent, or Firm* — Charles E. Bergere

(57) ABSTRACT

A multi-bit flip-flop has first and second one-bit flip-flops. The multi-bit flip-flop employs inter-cell clock switch (CSW) sharing in which the first and second one-bit flip-flops share at least one clock switch. The multi-bit flip-flop may also employ intra-cell CSW sharing in which at least one of the first and second one-bit flip-flops shares at least one clock switch. The inter-cell CSW sharing enables implementation of multi-bit flip-flops with fewer clock switches and possibly fewer data devices, while reducing power consumption, including state retention power gating power reduction.

8 Claims, 4 Drawing Sheets

MULTI-BIT FLIP-FLOP WITH SHARED CLOCK SWITCH

BACKGROUND

The present invention relates to digital logic circuits and, more particularly, to multi-bit flip-flops.

FIG. 1 is a schematic circuit diagram of a conventional one-bit, rising-edge-triggered, master-slave D flip-flop (also known as a static D flip-flop or SDFF) 10. The SDFF 10 comprises a master latch 11 and a slave latch 15. During a first phase of a system clock signal CK, the master latch 11 receives and latches a one-bit FF input signal D and, during the next phase of the system clock signal CK, the slave latch 15 receives the one-bit output signal m from the master latch and presents a one-bit FF output signal Q, while the master latch 11 receives and latches the next value of the one-bit FF input signal D.

In particular, a clock source 103 receives the system clock signal CK and includes a pair of inverters 104 and 106 connected in series to generate opposite-phase and in-phase clock signals cn and c, which it supplies to the flip-flop 10.

The master latch 11 comprises first and second clocked inverter stages 12 and 14 and a first (unclocked) inverter INV1. The first stage 12 has a p-type complementary metal-oxide semiconductor (PMOS) clock switch SP1, a PMOS MP1, an n-type CMOS (NMOS) data device MN1, and NMOS clock switch SN1, all connected in series. The second stage 14 has analogous data device MP2 and MN2 and clock switches SP2 and SN2, all connected in series.

Similarly, the slave latch 15 includes third and fourth clocked inverter stages 16 and 18, having analogously configured data devices MP3, MN3, MP4, and MN4 and clock switches SP3, SN3, SP4, and SN4, and a second (unclocked) inverter INV2.

When the clock signal c is low and the clock signal cn is high, the first stage 12 is on, and the data output pm of the first stage 12 will be the opposite of its data input D. Similarly, the fourth stage 18 is on, and the data output ss of the fourth stage 18 will be the opposite of its data input Q. When the clock signal c is high and the clock signal cn is low, the first and fourth stages 12 and 18 will be off.

On the other hand, when the clock signal c is high and the clock signal cn is low, the second stage 14 is on, and the data output pm of the second stage 14 will be the opposite of its data input m. Similarly, the third stage 16 is on, and the data output ss of the third stage will be the opposite of its data input m. When the clock signal c is low and the clock signal cn is high, the second and third stages 14 and 16 will be off.

The data output signals of the first and second stages 12 and 14 appear at the node pm. The data input signal of the second and third stages 14 and 16 is provided by the data output signal of the first inverter INV1 at the node m, which is the output of the master latch 11 and the input of the slave latch 15. The data output signals of the third and fourth stages 16 and 18 appear at the node ss. The data input signal of the fourth stage 18 is provided by the data output signal of the second inverter INV2 at the node Q, which is at the output of the slave latch 15 and the output of the D flip-flop 10.

Since a large number of flip-flops may be used in a typical integrated circuit (IC), the cumulative power consumption of all of the flip-flops can be significant. Various techniques have been used to reduce the power consumption of flip-flops.

Clock signal switching is inherently more frequent than data signal switching and therefore typically accounts for a larger proportion of the power consumption than data signal switching. One known technique for reducing power consumption involves gating (switching OFF) the clock signals when the flip-flop output is equal to its input. Another known technique uses dynamic logic, instead of static logic, to reduce the number of components. However, most known techniques used to reduce power consumption have the disadvantages of increasing circuit area and/or leading to performance penalties such as increased set-up or hold times, clock glitches, and the risk of unstable operation.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, an article of manufacture comprises a multi-bit flip-flop comprising at least a first one-bit flip-flop and a second one-bit flip-flop, wherein the multi-bit flip-flop employs inter-cell clock switch (CSW) sharing in which the first and second one-bit flip-flops share at least one clock switch.

It is highly desirable to reduce power consumption and die size in integrated circuits having flip-flops. One such solution for a one-bit flip-flop was introduced in U.S. Pat. No. 8,941,429 ("the '429 patent"), the teachings of which are incorporated herein by reference in its entirety, where an intra-cell clock-switch (CSW) sharing technique was introduced to reduce four pairs of clock switches to two pairs, such that the clock-switch power consumption can be theoretically reduced by 50%.

Figure 1:
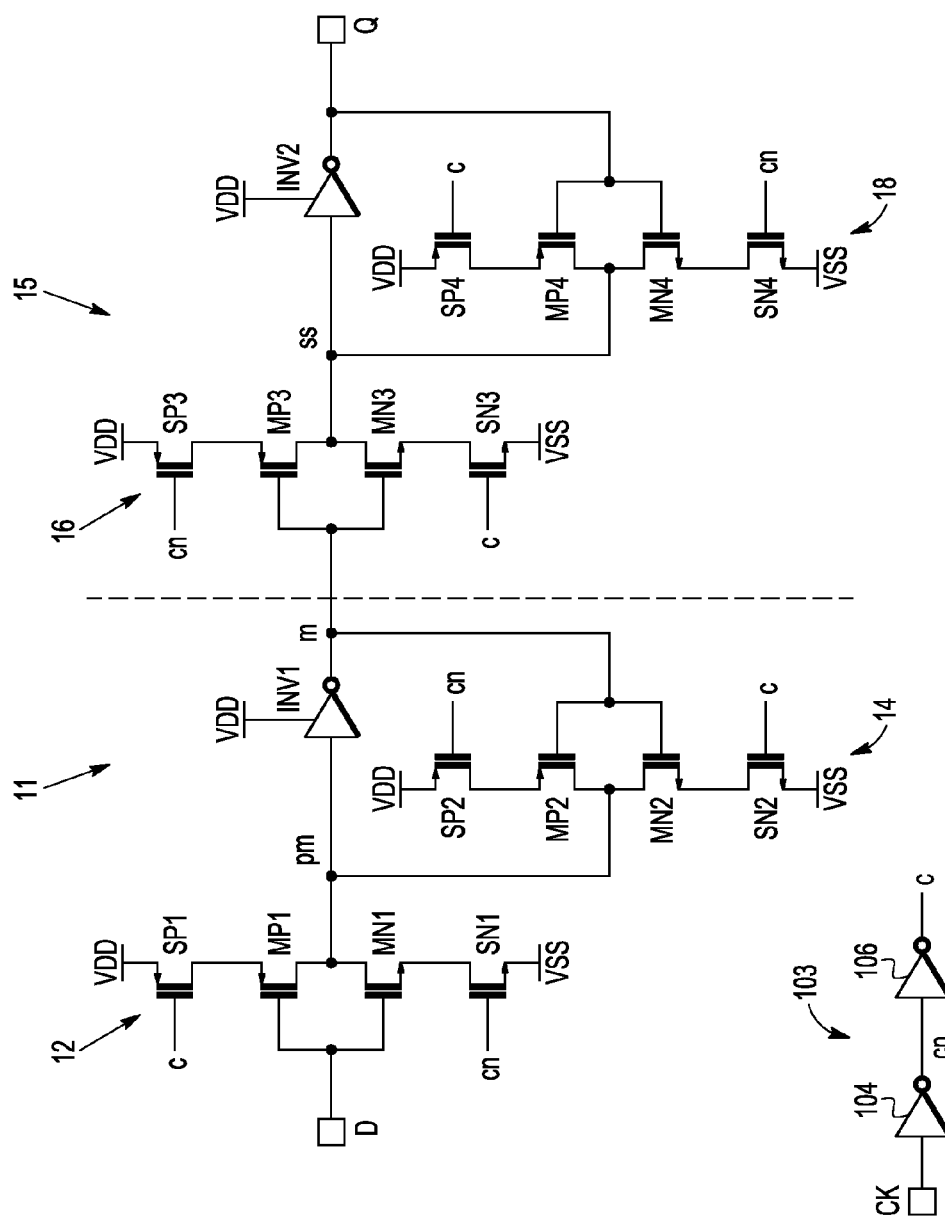
FIG. 1 is a schematic circuit diagram of a conventional one-bit master-slave D flip-flop.
Figure 2:
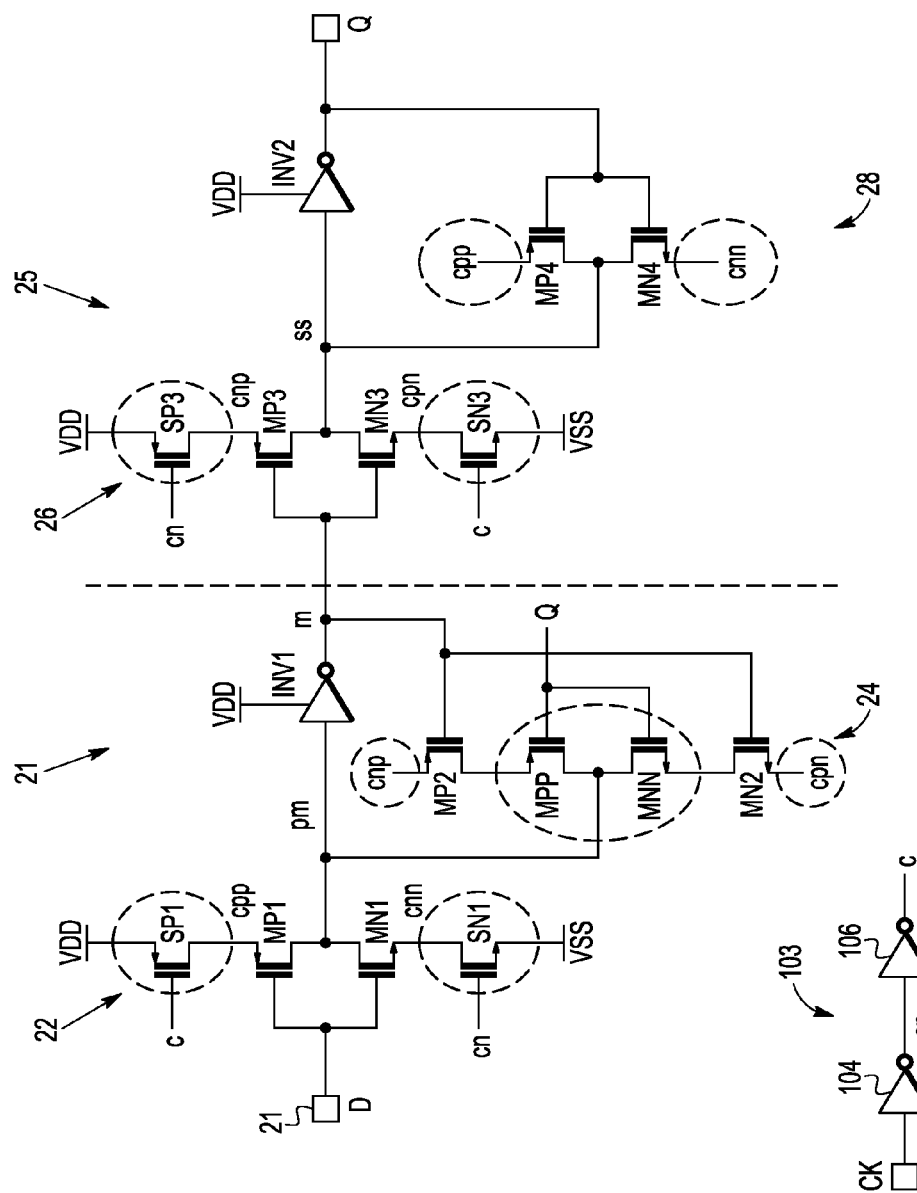
FIG. 2 is a schematic circuit diagram of a conventional one-bit master-slave flip-flop with intra-cell clock-switch (CSW) sharing.

FIG. 2 is a schematic circuit diagram of a one-bit master-slave static flip-flop 20, as disclosed in the '429 patent. Similar to the D flip-flop 10 of FIG. 1, the D flip-flop 20 has four clocked inverter stages 22, 24, 26, and 28 and two (unclocked) inverters INV1 and INV2.

As described previously with respect to the flip-flop 10 of FIG. 1, when the clock signal c is low and the clock signal cn is high, the first and fourth stages 12 and 18 are both on, while the second and third stages 14 and 16 are both off. Similarly, when the clock signal c is high and the clock signal cn is low, the first and fourth stages 12 and 18 are both off, while the second and third stages 14 and 16 are both on.

The design of the flip-flop 20 takes advantage of these operating characteristics by employing intra-cell CSW sharing in which specific clock switches are shared between different stages to reduce the total number of clock switches in the flip-flop 20 as compared to the flip-flop 10 and thereby enables reductions in both power consumption and layout size (circuit area).

In particular, for the implementation shown in FIG. 2, the clock switch SP4 in the fourth stage 18 of the flip-flop 10 of FIG. 1 is eliminated, and the drain node cpp of the clock switch SP1 in the first stage 22 of the flip-flop 20 is also connected to the source node of the data device MP4 in the fourth stage 28, such that the clock switch SP1 is shared between the first and fourth stages 22 and 28. Similarly, the clock switch SN4 in the fourth stage 18 of the flip-flop 10 of FIG. 1 is eliminated, and the drain node cnn of the clock switch SN1 in the first stage 22 of the flip-flop 20 is also connected to the source node of the data device MN4 in the fourth stage 28, such that the clock switch SN1 is also shared between the first and fourth stages 22 and 28. As such, the first and fourth stages 22 and 28 of the flip-flop 20 will both be on and both be off at the same time.

In an analogous manner, the clock switch SP2 in the second stage 14 of the flip-flop 10 of FIG. 1 is eliminated, and the drain node cnp of the clock switch SP3 in the third stage 26 of the flip-flop 20 is also connected to the source of the data device MP2 in the second stage 24, such that the clock switch SP3 is shared between the second and third stages 24 and 26. Similarly, the clock switch SN2 in the second stage 14 of the flip-flop 10 of FIG. 1 is eliminated, and the drain node cpn of the clock switch SN3 in the third stage 26 of the flip-flop 20 is also connected to the source of the data device MN2 in the second stage 24, such that the clock switch SN3 is also shared between the second and third stages 24 and 26. As such, the second and third stages 24 and 26 of the flip-flop 20 will both be on and both be off at the same time.

Note that, as described in further detail in the '429 patent, in order avoid logic-contention problems, p-type and n-type data devices MPP and MNN are added to the second stage 24 of the flip-flop 20.

The flip-flop 20 has fewer clock switches and therefore lower power consumption than the flip-flop 10 of FIG. 1, while ensuring that (a) the flip-flop 20 is fully static logic, (b) the performance of the flip-flop 20 is equal to or better than the flip-flop 10, and will not cause logic contention, (c) the size of the flip-flop 20 is smaller than that of the flip-flop 10 in FIG. 1, (d) the flip-flop 20 presents less loading to the external clock tree than the flip-flop 10, and (e) the flip-flop 20 allows the use of other, additional power reduction techniques.

Figure 3:
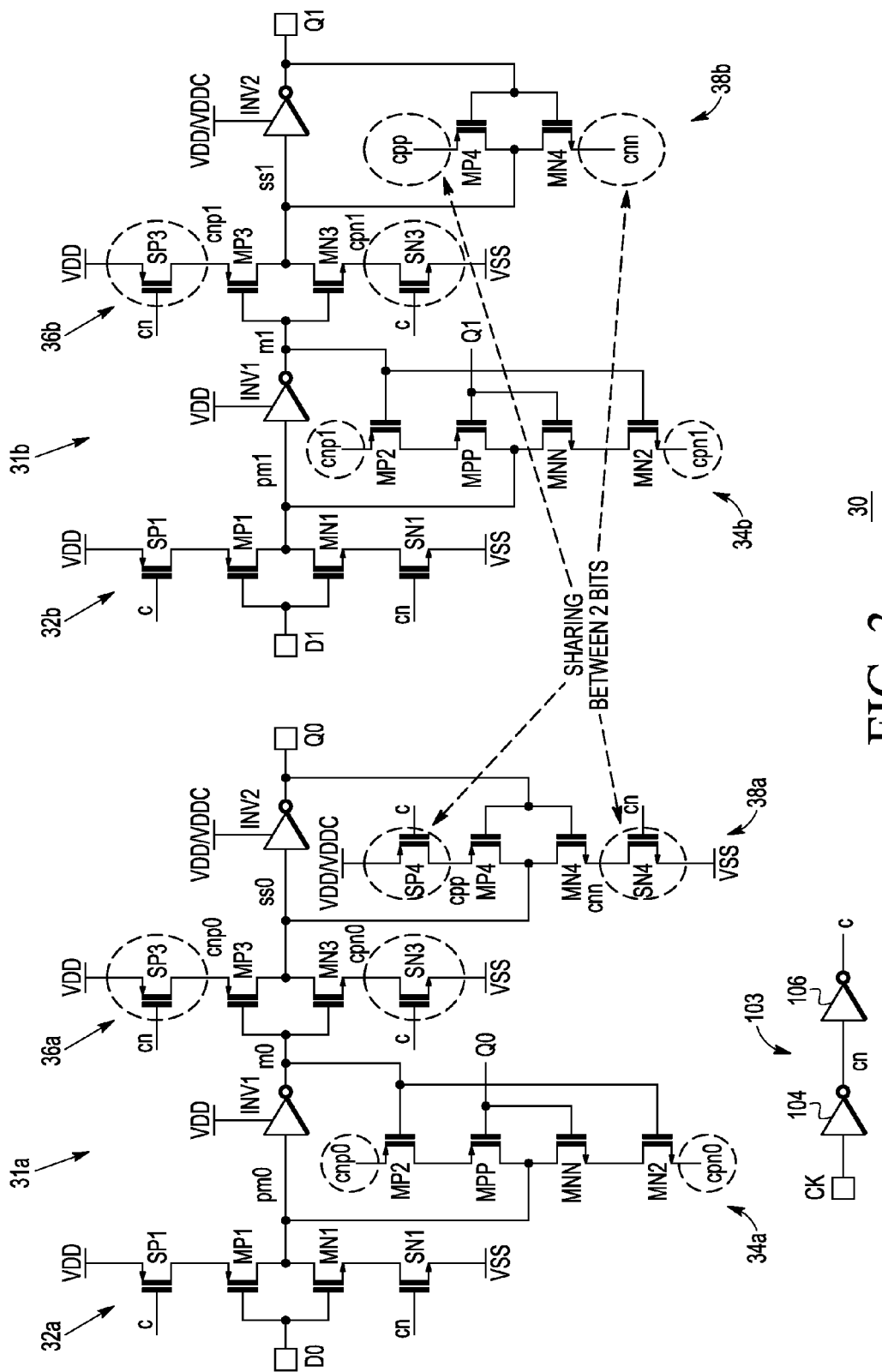
FIG. 3 is a schematic circuit diagram of a two-bit flip-flop, according to one embodiment of the invention, having both intra-cell and inter-cell CSW sharing.

FIG. 3 is a schematic circuit diagram of a two-bit flip-flop 30 having both intra-cell and inter-cell CSW sharing according to one embodiment of the invention. The two-bit flip-flop 30 comprises first and second one-bit flip-flops 31a and 31b, each having a master-slave architecture analogous to that of flip-flop 20 of FIG. 2. The two-bit flip-flop 30 operates analogously to the one-bit flip-flops 10 and 20 of FIGS. 1 and 2, except that the two-bit flip-flop 30 latches two one-bit input signals D0 and D1 and presents them as two one-bit output data signals Q0 and Q1, in parallel, as controlled by a single system clock signal CK.

Like the flip-flop 20 of FIG. 2, each one-bit flip-flop 31a/31b has intra-cell CSW sharing. In particular, the first flip-flop 31a shares its clock switches SP3 and SN3 between its second and third stages 34a and 36a, and the second flip-flop 31b shares its clock switches SP3 and SN3 between its second and third stages 34b and 36b.

In addition, the two-bit flip-flop 30 also has inter-cell CSW sharing. In particular, the clock switch SP4 in the fourth stage 38a of the first flip-flop 31a is shared with the fourth stage 38b of the second flip-flop 31b, such that the drain node cpp of the clock switch SP4 in the fourth stage 38a of the first flip-flop 31a is also connected to the source node of the data device MP4 in the fourth stage 38b of the second flip-flop 31b.

Similarly, the clock switch SN4 in the fourth stage 38a of the first flip-flop 31a is shared with the fourth stage 38b of the second flip-flop 31b, such that the drain node cnn of the clock switch SN4 in the fourth stage 38a of the first flip-flop 31a is also connected to the source node of the data device MN4 in the fourth stage 38b of the second flip-flop 31b. As such, the fourth stages 38a and 38b of the first and second flip-flop 31a and 31b will both be on and both be off at the same time.

As indicated in FIG. 3, the power supply voltage (VDD/VDDC) applied to the second inverter INV2 and the fourth stage 38a/38b of each one-bit flip-flop 31a/31b can be (but does not have to be) different from the power supply voltage (VDD) applied to the first inverter INV1 and the first, second, and third stages 32a/32b-36a/36b of each one-bit flip-flop 31a/31b. This enables the two-bit flip-flop 30 to be implemented with energy-saving state retention power gating (SRPG), in which the power supply VDD is gated, while the power supply VDDC is always on.

Compared to two instances of the one-bit flip-flop 20 of FIG. 2, the inter-cell CSW sharing of the two-bit flip-flop 30 enables the two-bit flip-flop 30 to be implemented with two extra clock switches. On the other hand, the flip-flops 20 of FIG. 2 cannot support SRPG without causing logic-contention issues or power domain issues.

Figure 4:
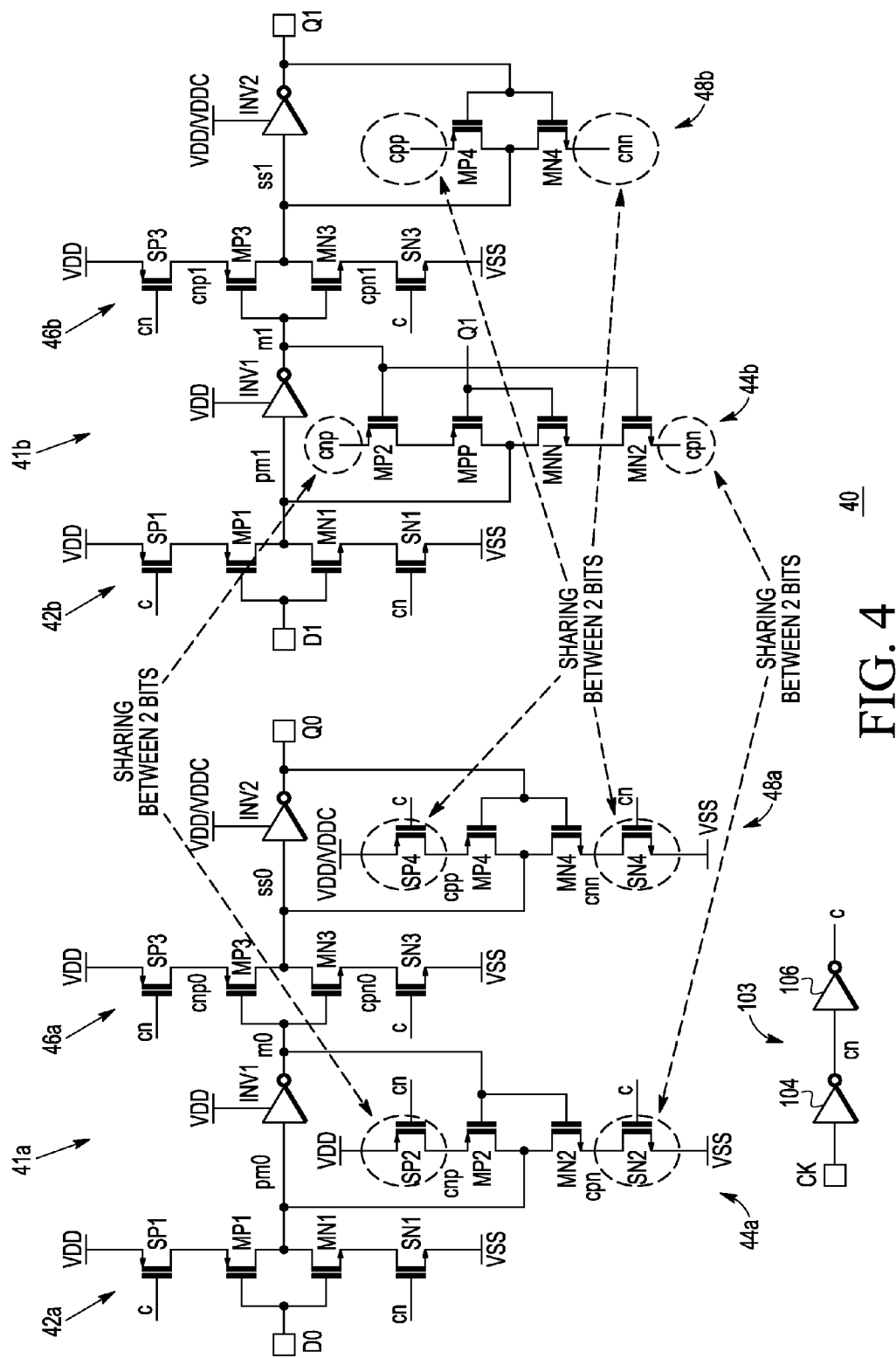
FIG. 4 is a schematic circuit diagram of a two-bit flip-flop, according to another embodiment of the invention, having only inter-cell CSW sharing.

FIG. 4 is a schematic circuit diagram of a two-bit flip-flop 40 comprising two one-bit flip-flops 41a and 41b having only inter-cell CSW sharing according to an embodiment of the invention. The two-bit flip-flop 40 is analogous to the two-bit flip-flop 30 of FIG. 3, except that the flip-flop 40 has only inter-cell CSW sharing.

In particular, like flip-flop 30, flip-flop 40 shares clock switches SP4 and SN4 between the fourth stages 48a and 48b of the first and second one-bit flip-flops 41a and 41b. In addition, the clock switch SP2 in the second stage 44a of the first flip-flop 41a is shared with the second stage 44b of the second flip-flop 41b, such that the drain node cnp of the clock switch SP2 in the second stage 44a of the first flip-flop 41a is also connected to the source node of the data device MP2 in the second stage 48b of the second flip-flop 41b. Similarly, the clock switch SN2 in the second stage 44a of the first flip-flop 41a is shared with the second stage 44b of the second flip-flop 41b, such that the drain node cpn of the clock switch SN2 in the second stage 44a of the first flip-flop 41a is also connected to the source node of the data device MN2 in the second stage 48b of the second flip-flop 41b. As such, the second stages 48a and 48b of the first and second flip-flop 41a and 41b will both be on and both be off at the same time.

Note that, because the flip-flop 40 does not have any intra-cell CSW sharing, the two extra data devices MPP and MNN that had been added to flip-flops 20 and 30 to avoid logic contention can be eliminated from the second stages 44a and 44b of the first and second flip-flops 41a and 41b. As such, compared to the two-bit flip-flop 30 of FIG. 3, the inter-cell-only CSW sharing of the two-bit flip-flop 40 enables the two-bit flip-flop 40 to be implemented with four fewer data devices.

Furthermore, like flip-flop 30 of FIG. 3 and as indicated in FIG. 4, the two-bit flip-flop 40 can be implemented with energy-saving SRPG, in which the power supply voltage (VDDC) applied to the second inverter INV2 and the fourth stage 48a/48b of each one-bit flip-flop 41a/41b is different from the power supply voltage (VDD) applied to the first inverter INV1 and the first, second, and third stages 42a/42b-46a/46b of each one-bit flip-flop 41a/41b.

The invention has been described in the context of the two-bit flip-flop 30 of FIG. 3, which employs both intra-cell CSW sharing and inter-cell CSW sharing, and the two-bit flip-flop 40 of FIG. 4, which employs only inter-cell CSW sharing. It will be understood that such CSW sharing can be implemented in the context of other two-bit flip-flop implementations.

For example, for intra-cell CSW sharing of FIG. 3, the switch devices SP2 and SN2 of the second stages 34a and 34b can be shared with the third stages 36a and 36b, instead of the switch devices SP3 and SN3 of the third stages 36a and 36b being shared with the second stages 34a and 34b.

Similarly, for the inter-cell CSW sharing of FIGS. 3 and 4, the switch devices SP4 and SN4 of the fourth stage 38b/48b of the second flip-flop 31b/41b can be shared with the fourth stage 38a/48a of the first flip-flop 31a/41a, instead of the switch devices SP4 and SN4 of the fourth stage 38a/48a of the first flip-flop 31a/41a being shared with the fourth stage 38a/48a of the second flip-flop 31b/41b.

Lastly, for the inter-cell CSW sharing of FIG. 4, the switch devices SP2 and SN2 of the second stage 44b of the second flip-flop 41b can be shared with the second stage 44a of the first flip-flop 41a, instead of the switch devices SP4 and SN4 of the second stage 44a of the first flip-flop 41a being shared with the second stage 44a of the second flip-flop 41b.

The two-bit flip-flop 30 of FIG. 3 has intra-cell CSW sharing between the second and third stages 34a/34b and 36a/36b and inter-cell CSW sharing between the fourth stages 38a and 38b. In addition or instead, two-bit flip-flops of the invention may have inter-cell CSW sharing between the first stages 32a and 32b and/or between the third stages 36a and 36b, although logic contention may be an issue with some of these alternative embodiments.

Similarly, the two-bit flip-flop 40 of FIG. 4 has inter-cell CSW sharing between the second stages 44a and 44b and between the fourth stages 48a and 48b. In addition or instead, two-bit flip-flops of the invention may have inter-cell CSW sharing between the first stages 42a and 42b and/or between the third stages 46a and 46b, although here, too, logic contention may be an issue with some of these alternative embodiments.

Although the invention has been described in the context of two-bit flip-flops having inter-cell CSW sharing between two one-bit flip-flops, either with or without intra-cell CSW sharing, the inter-cell CSW sharing of the invention can be extended to implement multi-bit flip-flops having more than two one-bit flip-flops with inter-cell CSW sharing between different one-bit flip-flops, either with or without intra-cell CSW sharing. In general, the invention can be characterized as covering multi-bit flip-flops having two or more one-bit flip-flops in which at least one clock switch is shared between at least two of the one-bit flip-flops.

Although the invention has been described in the context of rising-edge-triggered flip-flops, those skilled in the art will understand how to implement the invention in the context of falling-edge-triggered flip-flops.

Although the invention has been described in the context of flip-flops implemented using CMOS devices, those skilled in the art will understand that the invention may be able to be implemented in the context of other suitable types of transistor devices.

Although the invention has been described in the context of static D flip-flops having four clocked inverter stages and two (unclocked) inverters, those skilled in the art will understand how to implement the invention in the context of other types of flip-flops, such as D flip-flops with reset or with set or with both reset and set. For those types of D flip-flops, some of the clocked inverter stages or unclocked inverter stages would be changed to clocked NAND or NOR, or unclocked NAND or NOR gates. Also, the first clocked inverter stage can be changed to a clocked MUX (multiplex) stage to support scannable D flip-flops.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is to be understood that the foregoing description is intended to illustrate and not to limit the scope of the invention, which is defined by the scope of the appended claims. Other embodiments are within the scope of the following claims.

It is noted that various non-limiting embodiments described and claimed herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

The invention claimed is:

1. An article of manufacture comprising a multi-bit flip-flop, comprising:
   at least a first one-bit flip-flop; and
   a second one-bit flip-flop,
   wherein the multi-bit flip-flop employs inter-cell clock switch (CSW) sharing in which the first and second one-bit flip-flops share at least a first p-type clock switch and at least a first n-type clock switch, wherein the first p-type and n-type clock switches are part of a single clocked inverter stage in the multi-bit flip-flop.

2. The article of claim 1, wherein the multi-bit flip-flop employs intra-cell CSW sharing in which at least one of the first and second one-bit flip-flops shares at least one clock switch.

3. The article of claim 1, wherein the first and second one-bit flip-flops share a second p-type clock switch and a second n-type clock switch, wherein the second p-type and n-type clock switches are part of a different clocked inverter stage in the multi-bit flip-flop.

4. The article of claim 1, wherein each of the first and second one-bit flip-flops employs intra-cell CSW sharing in which two different clocked inverter stages share a p-type clock switch and an n-type clock switch.

5. The article of claim 1, wherein the single clocked inverter stage in the multi-bit flip-flop is powered by a first power supply different from a second power supply used to power one or more other clocked inverter stages in the multi-bit flip-flop.

6. The article of claim 5, wherein the second power supply is a gated power supply to enable state retention power gating to be implemented for the multi-bit flip-flop.

7. The article of claim 1, wherein the first and second one-bit flip-flops are clocked based on a single system clock signal.

8. The article of claim 1, wherein the article comprises an integrated circuit comprising the multi-bit flip-flop.

* * * * *